(12) United States Patent
Brink et al.

(10) Patent No.: US 9,646,883 B2
(45) Date of Patent: May 9, 2017

(54) CHEMOEPITAXY ETCH TRIM USING A SELF ALIGNED HARD MASK FOR METAL LINE TO VIA

(71) Applicant: INTERNATIONAL BUSINESS MACHINES CORPORATION, Armonk, NY (US)

(72) Inventors: Markus Brink, White Plains, NY (US); Michael A. Guillorn, Yorktown Heights, NY (US); Chung-Hsun Lin, White Plains, NY (US); HsinYu Tsai, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/738,284

(22) Filed: Jun. 12, 2015

(65) Prior Publication Data
US 2016/0365280 A1    Dec. 15, 2016

(51) Int. Cl.
*H01L 23/48*    (2006.01)
*H01L 21/768*    (2006.01)
(Continued)

(52) U.S. Cl.
CPC .. *H01L 21/76897* (2013.01); *H01L 21/02118* (2013.01); *H01L 21/31133* (2013.01); *H01L 21/76802* (2013.01); *H01L 21/76877* (2013.01); *H01L 23/528* (2013.01); *H01L 23/5226* (2013.01); *H01L 23/5329* (2013.01)

(58) Field of Classification Search
CPC ....... H01L 21/67138; H01L 21/823475; H01L 27/124; H01L 2224/06148
See application file for complete search history.

(56) References Cited

U.S. PATENT DOCUMENTS

| 7,993,816 | B2 | 8/2011 | Black et al. |
| 8,114,769 | B1 | 2/2012 | Srivastava et al. |
| 2012/0241411 | A1 | 9/2012 | Darling et al. |

FOREIGN PATENT DOCUMENTS

WO    2014120320 A3    8/2014

OTHER PUBLICATIONS

Li et al., Fabrication of Metallized Nanoporous Films from the Self-Assembly of a Block Copolymer and Homopolymer Mixture, Langmuir, May 2007, pp. 6883-6888, vol. 23 No. 13, American Chemical Society.

(Continued)

*Primary Examiner* — Elias M Ullah
(74) *Attorney, Agent, or Firm* — Tutunjian & Bitetto, P.C.; Louis J. Percello

(57) ABSTRACT

A method of forming metal lines that are aligned to underlying metal features that includes forming a neutral layer atop a hardmask layer that is overlying a dielectric layer. The neutral layer is composed of a neutral charged di-block polymer. Patterning the neutral layer, the hardmask layer and the dielectric layer to provide openings that are filled with a metal material to provide metal features. A self-assembled di-block copolymer material is deposited on a patterned surface of the neutral layer and the metal features. The self-assembled di-block copolymer material includes a first block composition with a first affinity for alignment to the metal features. The first block composition of the self-assembled di-block copolymer is converted to a metal that is self-aligned to the metal features.

16 Claims, 6 Drawing Sheets

(51) Int. Cl.
   *H01L 21/02*    (2006.01)
   *H01L 21/311*   (2006.01)
   *H01L 23/528*   (2006.01)
   *H01L 23/522*   (2006.01)
   *H01L 23/532*   (2006.01)

(56) References Cited

OTHER PUBLICATIONS

Fahmi et al., Fabrication of Metallized Nanowires from Self-Assembled Diblock Copolymer Templates, Advanced Materials, Jul. 2003, pp. 1201-1204, vol. 15, No. 14.
Schaffer et al., Reduction of metal oxides by mechanical alloying, Applied Physics Letters, Apr. 1989, pp. 45-46, vol. 55, No. 1.
Luidold et al., Hydrogen as a Reducing Agent: State-of-the-Art Science and Technology, JOM, Jun. 2007, pp. 20-26, vol. 59, No. 6.
Bang et al., Facile Routes to Patterned Surface Neutralization Layers for Block Copolymer Lithography**, Adv. Mater. Nov. 2007, pp. 4552-4557, vol. 19, No. 24.
Mansky et al., Controlling Polymer-Surface Interactions with Random Copolymer Brushes, Science, Mar. 1997, pp. 1458-1460, vol. 275, Downloaded from www.sciencemag.org on Jun. 9, 2015.
Ryu et al., A Generalized Approach to the Modification of Solid Surfaces, Science, Apr. 2005, pp. 236-239, vol. 38, Downloaded from www.sciencemag.org on Jun. 9, 2015.

CHEMOEPITAXY ETCH TRIM USING A SELF ALIGNED HARD MASK FOR METAL LINE TO VIA

BACKGROUND

Technical Field

The present disclosure relates to patterning of electrical structures, and more particularly to forming lines and vias corresponding to underlying metal features.

Description of the Related Art

The fabrication of Very-Large Scale Integrated (VLSI) or Ultra-Large Scale Integrated circuit (ULSI) requires metallic wiring that connects individual devices in a semiconductor chip, to one another. One method of creating this wiring network on such small scale is a dual damascene (DD) process. In a typical DD process, an interlayer dielectric (ILD) typically comprising two dielectric layers (e.g., a via level dielectric and a line level dielectric) is formed on a substrate. In general, the via and line level dielectrics can be made of the same or different insulating films and in the former case applied as a single monolithic layer. A hard mask layer is optionally employed to facilitate etch selectivity and to serve as a polish stop. The wiring interconnect network consists of two types of features: line features that traverse a distance across the chip, and via features which connect lines in different levels together. Decreasing the critical dimensions (CD) and minimum pitch of features in a nanoscale pattern used to fabricate integrated circuits (ICs) increases the density of devices on a chip. Decreasing critical dimensions and minimum pitch further into the nanoscale realm requires advanced patterning methodologies.

SUMMARY

In one embodiment, the present disclosure provides a method of forming metal lines that are aligned to underlying vias using a mask comprised of self-assembling di-block copolymer. In one embodiment, the method includes forming a neutral layer overlying a dielectric layer. The neutral layer and the dielectric layer may be patterned to provide openings that are filled with a metal material to provide metal features. A self-assembled di-block copolymer material is deposited on a patterned surface of the neutral layer and the metal features. The self-assembled di-block copolymer material includes a first block composition with a first affinity for alignment to the metal features. The first block composition of the self-assembled di-block copolymer is converted to a metal that is self-aligned to the metal features.

In another embodiment, the method includes forming a neutral layer overlying a dielectric layer; and forming first metal features through the neutral layer and the dielectric layer. A self-assembled di-block copolymer material is deposited atop the neutral layer and the first metal features. The self-assembled di-block copolymer material includes a first block composition with a first affinity for alignment to the first metal features. The first block composition of the self-assembled di-block copolymer material that is aligned with the first metal features may be removed selectively to a remainder of the self-assembled di-block that is not aligned with the first metal features. A metal is formed in opening provided by removing the first block composition to provide a second metal feature that is self-aligned with the first metal features.

In another aspect of the present disclosure, an electrical communication structure is provided that includes metal lines that are self-aligned to vias. In one embodiment, the structure includes first metal features including vias in a dielectric layer; and a neutral charged di-block polymer layer on at least a portion of dielectric layer. The structure may further include metal lines present in a layer including a block copolymer composition from a self-assembled di-block copolymer layer that is present atop the neutral charged di-block polymer layer. The metal lines are self-aligned to the vias.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
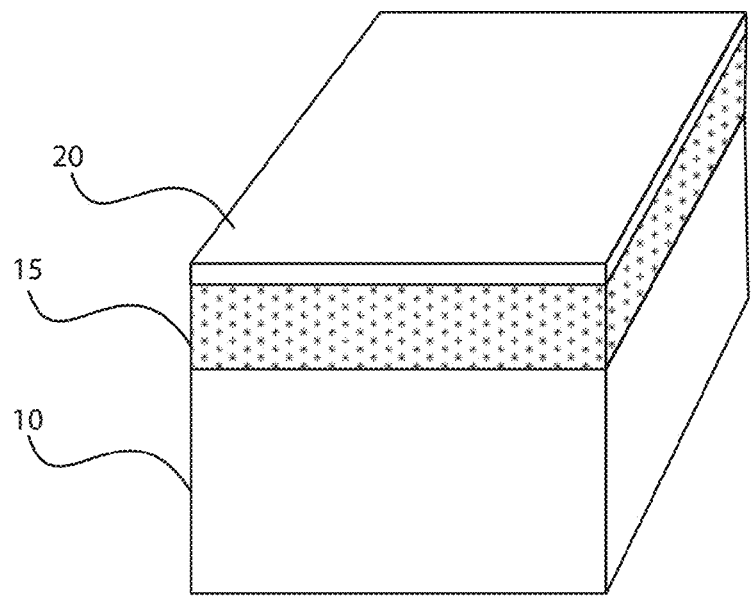
FIG. 1 is a perspective view of hardmask layer that is present atop a dielectric layer, in accordance with one embodiment of the present disclosure.

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Patterning solutions for sub 40 nm pitch wiring are of importance to continued complementary metal oxide semiconductor (CMOS) device scaling. It has been determined that metal wiring alignment with respect to underlying via patterns is one of the major limitations to continued wire pitch scaling. The methods and structures disclosed herein can provide one way to self-align sub-resolution metal lines to underlying via patterns using directed self-assembly (DSA) of a block copolymer (BCP) to form dense lines that are self-aligned to the underlying via pattern. As discussed in greater detail below, the direct self-assembled (DSA) lines of block copolymer (BCP) can be directly converted into metal lines using a sequential infiltration synthesis (SIS), removal of the polymer scaffold, and reduction of the SIS material to provide a metal. In some embodiments, using the methods provided herein, metal lines down to a 15 nm pitch can be directly formed and aligned to underlying vias in the same time.

As used herein, a "DSA material" is a material capable of self-assembling into compositionally different phase-separated domains. The DSA material preferably comprises a block copolymer (BCP). Non-limiting block copolymers include di-block and tri-block copolymers. A "DSA layer" is a layer comprising an SA material. A block copolymer for self-assembly comprises at least two blocks that are immiscible with each other. A block copolymer, e.g., di-block copolymer, is a polymer consisting of two types of monomers, A and B. The monomers are arranged such that there is a chain of each monomer, and those two chains are grafted together to form a single copolymer chain. A large collection of di-block copolymers is called a polymer melt, and below a certain temperature this melt will exhibit a phase transition. Above the transition temperature the amount of A and B is equally distributed throughout the material. This is the disordered state of the material and exhibits no spatial variance, and thus possesses the same type of translational symmetry found in liquids. Self-assembly (SA) of the block copolymer (BCP) occurs by phase separation of the blocks to form a pattern of segregated solid phase domains. As an example, self-assembly of a di-block copolymer produces a domain pattern comprising a first domain containing substantially a first block A of the di-block copolymer and a second domain containing substantially a second block B of the di-block copolymer. In this instance, the first and second domains are linked by the covalent bond joining block A to block B of the block copolymer. Some embodiments, of the methods and structures of the present disclosure are now described in greater detail referring to FIGS. 1-9.

FIG. 1 depicts one embodiment of a hardmask layer 20 that is present atop a underlayer 15 that is present atop a substrate 10. The dielectric layer may be referred to as an "underlayer material".

The substrate 10 may be composed of any substrate material, such as semiconductor, metals or dielectrics. In one embodiment, the substrate 10 is composed of a semiconductor material, such as a type IV semiconductor material, e.g., silicon, silicon germanium, germanium or combinations thereof, or type III-V semiconductor material, e.g., gallium arsenic (GaAs). More particularly, the substrate can comprise a semiconducting material including, for example, Si, SiGe, SiGeC, SiC, Ge alloys, GaAs, InAs, InP, as well as other III-V or II-VI compound semiconductors. The substrate can also comprise a layered semiconductor such as Si/SiGe, or a semiconductor-on-insulator (SOI). The semiconductor material can be doped, non-doped or contain both doped and non-doped regions therein. The substrate 10 may include a number of electrical devices and components, such as semiconductor devices or memory devices. For example, the substrate may include transistors, e.g., field effect transistors (FET), fin type field effect transistors (FinFETs), bipolar junction transistors (BJTs), thin film transistors (TFTs) and combinations thereof; memory devices, such as random access memory (RAM), dynamic random access memory (DRAM), embedded dynamic access memory (EDRAM), flash memory and combinations thereof; and passive electrical devices, such as resistors and capacitors. The substrate 10 may also include interconnect metallization, such as metal lines and vias.

The underlayer 15 can be any layer having contact with the bottom of the neutral layer that is described with reference to FIG. 2. The composition of the material of the underlayer 15 can comprise organic material, inorganic material, organometallic material, or a combination of the foregoing materials. For example, the underlayer 15 may be composed of an oxide, nitride or oxynitride material. In some embodiments, the underlayer 15 may include multiple material layers. For example, an additional dielectric layer may be present between the underlayer 15, and the substrate 10. The additional dielectric layer (not shown) may be an oxide, nitride or oxynitride material. For example, when the dielectric layer is an oxide, the oxide may be provided by silicon oxide ($SiO_2$). In embodiments when the dielectric layer is a nitride, the nitride may be provided by silicon nitride ($Si_3N_4$). In yet other examples, the dielectric layer may be selected from the group consisting of silicon containing materials such as, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer include any of the aforementioned materials in porous form, or in a form that changes during processing to or from being porous and/or permeable to being non-porous and/or non-permeable.

The additional dielectric layer may be formed using a deposition process, such as chemical vapor deposition (CVD), plasma enhanced chemical vapor deposition (PECVD), metal organic chemical vapor deposition (MOCVD), and combinations thereof. In some embodiments, the additional dielectric layer may have a thickness ranging from 1 nm to 20 nm. In other embodiments, the additional dielectric layer may have a thickness ranging from 5 nm to 15 nm.

A hardmask layer 20 is present atop the uppermost surface of the underlayer 15.

The hard mask layer 20 includes a hard mask material such as silicon oxide, silicon nitride, silicon oxynitride, a silicon-titanium- or tungsten-based anti-reflective coating (ARC) material as known in the art, or combinations thereof. The hard mask layer 20 can be formed, for example, by chemical vapor deposition (CVD), atomic layer deposition (ALD), or spin-coating. The thickness of the hard mask layer 20 can be from 1 nm to 20 nm, although lesser and greater thicknesses can also be formed.

Figure 2:
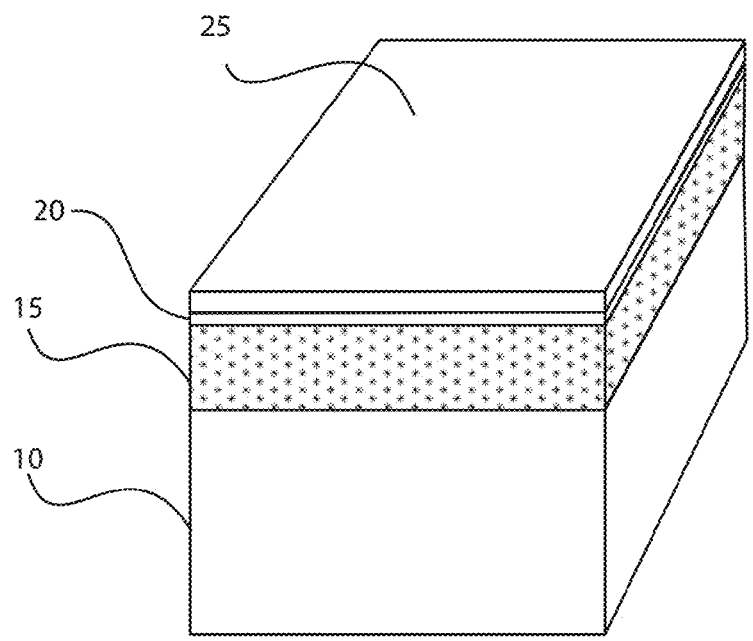
FIG. 2 is a perspective view of forming a neutral layer composed of a neutral charged di-block polymer on the hardmask layer that is depicted in FIG. 1, in accordance with one embodiment of the present disclosure.

FIG. 2 depicts forming a neutral layer 25 composed of a neutral charged di-block polymer on the hardmask layer that is depicted in FIG. 1. Herein, a surface, material layer, or an interface is said to be "neutral" to an direct self-assembled (DSA) material, or "neutral wetting" to an SA material, if each domain of the self-assembled SA material can wet the surface or the interface (i.e., each domain contacts the surface or the interface after self-assembly). Otherwise, the surface or interface is said to be "non-neutral" to the SA material.

The neutral layer 25 can include, e.g., a thin dielectric material having a thickness from 1 nm to 20 nm. In one embodiment, the neutral layer 25 includes a material having substantially the same affinity to two different polymeric block components within a self-assembling material layer, e.g., direct self-assembled (DSA) diblock copolymer (DBC) 40, to be subsequently applied thereupon. In one embodiment, the neutral layer 25 can include random polymers, i.e., polymers that obtained by polymerization of random sequences of different types of monomers.

The neutral layer 25 includes a material having an orientation control surface that allows the domains of the later deposited self-assembling material to be subsequently applied thereupon to orient in a set direction with respect to the substrate. This direction may be substantially perpendicular to the substrate 10, but in some cases may be parallel, depending on the material selected for the orientation control material portion, or the annealing method used.

In some examples, the neutral layer 25 may be composed of polymers comprising a hydroxyl group. These include hydroxyl-terminated polymers (e.g., hydroxyl-terminated poly(styrene-co-methyl methacrylate and blends of hydroxyl-terminated poly(styrene), hydroxyl-terminated poly(methyl methacrylate), and poly(styrene-b-methyl methacrylate)), hydroxyl-functionalized polymers (e.g., poly(styrene-co-methyl methacrylate-co-2-hydroxyethyl methacrylate)). Other underlayer materials include materials comprising reactive groups, such as those derived from epoxydicyclopentadiene methacrylate, glycidyl methacrylate, or vinyl cinnamates. Exemplary materials comprising reactive groups include poly(styrene-co-epoxydicyclopentadiene methacrylate), poly(styrene-co-methyl methacrylate-co-epoxydicyclopentadiene methacrylate), poly(styrene-co-methyl methacrylate-co-glycidyl methacrylate), poly(styrene-co-methyl methacrylate-co-vinyl cinnamate) poly (styrene-co-methyl methacrylate-co-vinyl benzocyclobutane), and poly(alpha-methyl styrene-co-methyl methacrylate)). The reactive polymers can react as a result of thermal or photochemical treatment either alone or in conjunction with an additional crosslinking agent. In particular, a catalytic species such as a strongly acidic species can be used to facilitate reaction. The strongly acidic species can be directly incorporated into the underlayer material or the solution comprising the underlayer material. Alternatively, a thermal acid generator or photoacid generator molecule can be used to generate an acidic species as a result of thermal or photochemical treatment, respectively. The above materials are particularly suitable for use with an self-assembled material comprising poly(styrene-b-methyl methacrylate) block copolymers. Poly(methyl glutarimide) (PMGI) can be an underlayer material for an SA material comprising poly(styrene-b-ethylene oxide) block copolymer.

Other non-limiting examples of materials for the neutral layer 25 include materials used in ARC layers, which can include homopolymers and copolymers selected from the group consisting of polybisphenols, polysulfones, polycarbonates, polyhydroquinones, polyphthalates, polybenzoates, polyphenylethers, polyhydroquinone alkylates, polycarbamates, polymalonates and mixtures thereof. These moieties are typically functionalized in order to tune the required physical properties of the polymer (e.g., optical properties, surface energy, etch resistance). The polymer components also typically contain a plurality of reactive sites distributed along the polymer for reaction with a crosslinking component.

More specific materials used in ARC layers include poly(4,4'-methylenebisphenol-co-epichlorohydrin), poly(4,4'-ethylidenebisphenol-co-epichlorohydrin), poly(4,4'-isopropylidenebisphenol-co-epichlorohydrin), poly(4,4'-isopropylidenebis[2-methylphenol]-co-epichlorohydrin), poly (4,4'-isopropylidenebis[2,6-dimethylphenol]-co-epichlorohydrin), poly(4,4'-cyclohexylidenebisphenol-co-epichlorohydrin), poly(4,4'-[1-phenylethylidene]bisphenol-co-epichlorohydrin), poly(4,4'-trifluoroisopropylidenebisphenol-co-epichlorohydrin), poly (4,4'-hexafluoroisopropylidenebisphenol-co-epichlorohydrin), poly(4,4'-sulfonylbisphenol-co-epichlorohydrin), poly(bisphenol AF adipic ester), poly (bisphenol AF succinic ester), poly(4,4'-hexafluoroisopropylidenediphthalate-co-epichlorohydrin), poly(4,4'-hexafluoroisopropylidenediphthalate-co-poly(bisphenol AF), poly(4,4'-hexafluoroisopropylidenebisbenzoate-co-epichlorohydrin), poly(3,3',4,4'-benzophenonetetracarboxylate-co-epichlorohydrin), poly(4,4'-hexafluoroisopropylidenediphthalate-co-epichlorohydrin-co-2,6-bis[hydroxymethyl]-p-cresol), poly(3,3',4,4'-benzophenonetetracarboxylate-co-epichlorohydrin-co-2,6-bis[hydroxymethyl]-p-cresol), poly(terephthalate-co-epichlorohydrin), poly(2-nitroterephthalate-co-epichlorohydrin), poly(2-nitrophthalate-co-epichlorohydrin), poly(2-nitroisophthalate-co-epichlorohydrin), poly(hydroquinone-co-epichlorohydrin), poly(methylhydroquinone-co-epichlorohydrin), poly(1,2,4-benzenetriol-co-epichlorohydrin), poly(methylene-bis[4-aminophenyl]-co-glycerol carbamate), poly(isopropylidene-bis[4-aminophenyl]-co-glycerol carbamate), poly (isopropylidene-bis[3-carboxy-4-aminophenyl]-co-glycerol carbamate), poly(methylene-bis[4-hydroxyphenyl]-co-glycerol carbonate), poly(isopropylidene-bis[4-hydroxyphenyl]-co-glycerol carbonate), poly(isopropylidene-bis[3-carboxy-4-hydroxyphenyl]-co-glycerol carbonate), poly(2-phenyl-1,3-propanediol malonate), poly(2-phenyl-1,3-propanediol 2-methyl-malonate), poly(1,3-propanediol benzylidene-malonate), poly(2-phenyl-1,3-propanediol benzylidene-malonate), glycidyl end-capped poly(bisphenol A-co-epichlorohydrin), and silicon-containing anti-reflection coating A940 from Shin Etsu. Other underlayer materials include poly(styrene-co-methyl methacrylate-co-epoxydicyclopentadiene methacrylate), poly(styrene-co-methyl methacrylate-co-glycidyl methacrylate), poly(styrene-co-methyl methacrylate-co-2-hydroxyethyl methacrylate), poly(styrene-co-methyl methacrylate-co-4-vinyl cinammate), poly(styrene-co-methyl methacrylate-co-vinyl benzocyclobutane), poly(styrene-co vinyl benzocyclobutane, poly(alpha-methyl styrene-co-methyl methacrylate), and poly(methyl glutarimide) (PMGI).

Other materials for the neutral layer 25 can include polymer brush materials, including hydroxyl-terminated poly(styrene-co-methyl methacrylate), poly(styrene-co-methyl methacrylate-co-2-hydroxyethyl methacrylate), hydroxyl-terminated poly(styrene), hydroxyl-terminated poly(methyl methacrylate), poly(styrene-b-methyl methacrylate) block copolymer, and combinations of the foregoing materials. Other underlayer materials include self-assembled monolayers.

Without wishing to be bound by any specific theory, the mechanism for the orientation control by the neutral layer 25 may depend on net surface energy, wetting characteristics, surface energy distribution, hydrogen bonding, net dipole moments, dipole moment density, or even composition. Materials creating the right characteristics for the orientation control material portion, e.g., neutral layer 25, may include: a cross linked organic polymer including an epoxy-based homopolymer or copolymer; a surface modified organic homopolymer or copolymer; a self-assembled monolayer, a polymer brush-modified layer, or a cross-linked organosilicate; random copolymer brushes, random cross-linked copolymers, or mixtures of polymer brushes or cross-linked polymers; some ARC materials, or even a properly and precisely oxidized silicon surface.

Polymer brushes can provide an orientation control surface suitable of a neutral layer 25, in which the surface is reactively modified to the desired thickness and surface properties using polymeric brush precursors with a desired composition, often followed by an additional rinse step to remove non-bound material. The composition of a random copolymer brush layer is tuned to afford the desired orientation control surface. This can be accomplished in some instances by randomly copolymerizing two monomers, for example the same monomers used in the self-assembling material (for the self-assembling material assembly). For example, in the embodiments in which the later formed direct self-assembled (DSA) di block copolymer (DCB) 35a, 35b includes two monomer, e.g., composition "A", such as PMMA (Poly methyl methacrylate), and composition "B", such as Polystyrene, a suitable neutral layer 25 would be a di-block copolymer (DCB) of monomers A and B, wherein the backbone of the DCB that provides the neutral layer comprises substantially 50% of monomer A, and substantially 50% of monomer B.

In other embodiments, end-group functionalization or incorporation of reactive-group containing monomers in the neutral layer 25 can be used to functionalize a polymers to provide grafting sites. See e.g., P. Mansky, Y. Liu, E. Huang, T. P. Russell, C. Hawker, "Controlling polymer surface interaction with random copolymer brushes," Science, 275, 1458, (1997). In further embodiments, the thermally crosslinkable neutral layers 25 may be based on, e.g., vinyl benzocyclobutene. See e.g., Du Yeol Ryu, Kyusoon Shin, Eric Drockenmuller, Craig J. Hawker, and Thomas P. Russell, "A generalized approach to modification of solid surfaces" Science, 308, 236, (2005). In other embodiments, the photopatternable underlayers, based on random copolymers of the monomers of the self-assembling material with an appropriate functional monomer, e.g., monomers having azide, glycidyl or acryloyl groups, may also be for the neutral layer 25. See e.g., Joona Bang, Joonwon Bae, Peter Lowenhielm, Christian Spiessberger, Susan A. Given-Beck, Thomas P. Russell, and Craig J. Hawker, "Facile routes to patterned surface neutralization layers for block copolymer lithography," Advanced Materials, vol. 19, p. 4552 (2007).

The neutral layer 25 can also be provided by use of a coating of a crosslinked epoxy-containing polymer prepared from monomers including glycidyl (meth)acrylate, 2,3-epoxycyclohexyl (meth)acrylate, (2,3-epoxycyclohexyl) methyl (meth)acrylate, 5,6-epoxynorbornene (meth)acrylate, epoxydicyclopentadienyl (meth)acrylate, and combinations including at least one of the foregoing. Herein, where "(meth)acrylate" is used, either an acrylate or methacrylate is contemplated unless otherwise specified. In some embodiments for example, specifically useful monomers include glycidyl methacrylate and epoxydicyclopentadienyl methacrylate.

Epoxy-containing polymers also include copolymers or terpolymers further containing at least one additional monomer in addition to the epoxy-containing monomer. Exemplary additional monomers include methyl (meth)acrylate, ethyl (meth)acrylate, butyl (meth)acrylate, hexyl (meth)acrylate, cyclohexyl (meth)acrylate, benzyl (meth)acrylate, ethylcyclopentyl (meth)acrylate, methylcyclopentyl (meth)acrylate, dicyclopentyl (meth)acrylate, 2-hydroxy ethyl (meth)acrylate, 2-hydroxy propyl (meth)acrylate, hydroxyadamantyl (meth)acrylate, adamantyl (meth)acrylate, methyladamantyl (meth)acrylate, ethyladamantyl (meth)acrylate, phenyladamantyl (meth)acrylate, hydroxyadamantyl (meth)acrylate, isobornyl (meth)acrylate, benzyl (meth)acrylate, gamma-butyrolactone (meth)acrylate, 5-methacryloxy-2,6-norbornane carbolactone, 5-acryloxy-2,6-norbornane carbolactone, 2,2,2-trifluoroethyl (meth)acrylate, 1,1,1,3,3,3-hexafluoroisopropyl (meth)acrylate, styrene, 4-methyl styrene, -methyl styrene, 4-hydroxy styrene, 4-acetoxy styrene, ethylene, propylene, 1-butene, 1,3-butadiene, vinyl acetate, dihydropyran, norbornene, maleic anhydride, or a combination including at least one of the foregoing additional monomers. The composition of the epoxy-containing polymer can be adjusted by varying the ratios and identities of the comonomers and/or by selecting the structure and/or functionality of the pendant group(s) on the (meth)acrylates.

Organosilicate or silicon oxide-based coatings on the substrate can also be used to provide the neutral layer 25. In an embodiment, useful surfaces may be provided by deposition of silicon dioxide or organosilicate as a vapor-deposited layer, or as a spin-on layer (organic spin-on glass, abbreviated OSG). Organosilicones, organo- or hydridosilsesquioxanes, or hybrid systems of these materials may be used to provide the orientation control surface, where such organosilicate coatings are advantageously crosslinkable to form a solid orientation control surface. Useful organosilicates include those derived from the hydrolytic condensation, catalyzed by acid or base, of hydridotrialkoxysilanes, alkyltrialkoxysilanes, alkyltrihalosilanes, dialkyldialkoxysilanes, dialkyldihalosilanes, tetraalkoxysilanes, bis(alkylenetrialkoxysilanes), and the like. Exemplary alkoxysilanes useful for preparing organosilicates include hydridotrimethoxysilane, hydridotriethoxysilane, dimethyldimethoxysilane, dimethyldiethoxysilane, methyltrimethoxysilane, ethyltrimethoxysilane, ethyltriethoxysilane propyltrimethoxysilane, propyltriethoxysilane, cyclohexyltriethoxysilane, phenyltriethoxysilane, tetramethoxysilane, tetraethoxysilane (TEOS), 1,2-ethylene bis(triethoxysilane), vinyltrimethoxysilane, vinyltriethoxysilane, glycidoxypropyltrimethoxysilane, epoxycyclohexylethyltriethoxysilane, (meth)acryloxypropyltrimethoxypropylsilane, (meth)acryloxypropyltriethoxypropylsilane, combinations of these, and the like.

The neutral layer 25 can be applied by any suitable method and is not particularly limited. Where polymer-based orientation control material are desired, the application of such layers to a surface of the substrate can be accomplished by a process including, e.g., spin-casting, dip-coating, doctor blading, spray dispense, or other suitable coating method, which is compatible with the processes and equipment used in microelectronics fabrication assembly lines. The neutral layer 25 can be formed using chemical vapor deposition (CVD), and other like deposition processes.

Solvents that can be used to deposit polymeric coatings for the orientation control material layer vary with the solubility requirements of these materials. Exemplary casting solvents include, but are not limited to: toluene, propylene glycol monomethyl ether acetate (PGMEA), propylene glycol monomethyl ether (PGME), ethoxyethyl propionate, anisole, ethyl lactate, 2-heptanone, cyclohexanone, amyl acetate, n-butyl acetate, γ-butyrolactone (GBL), and acetone.

The surface energy or composition required for the neutral layer 25 depends on the application. For example, in order to form polystyrene (PS)-poly(methyl methacrylate) (PMMA) perpendicular lamellae, a PS-PMMA random copolymer layer may be employed as the neutral layer 25 in order to make the lamellae stand up with substantially vertical interfaces there amongst. In one embodiment, the brush composition may be from 57% PS to 70% PS.

For a neutral layer 25, the efficacy of the orientation control at a particular composition can depend on the thickness of the neutral layer 25. The molecular architecture of the neutral layer 25 can also have an effect. For example, a polymer brush orientation control material may have a different composition range than for a cross-linked neutral layer 25 due to difference in mobility of the brush. For the same reason, a higher molecular weight brush may act differently from a lower molecular weight brush. Similar changes in the efficacy of the neutral layer 25 may be observed for cross-linked orientation control materials having the same composition but different molecular weights. The efficacy of neutral layer 25 may also depend on the thickness of the self-assembly material layer above the neutral layer 25 according to the relative difference in surface free energies among the polymeric block components. The exact orientation of polymer domains at the air interface or the polymer/orientation control interface may not be perpendicular to the substrate, even if the majority of each polymer domain is. The neutral layer 25 may still function even when it is weakly preferential. In some embodiments, the neutral layer 25 may not cause polymer domains not to stand perpendicular to the substrate. For example, spheres or parallel cylinders may be employed as shapes of a phase-separated polymeric component in order to subsequently create hole patterns or line patterns.

In some embodiments, the neutral layer 25 can have a thickness from 1 nm to 20 nm.

Figure 3:
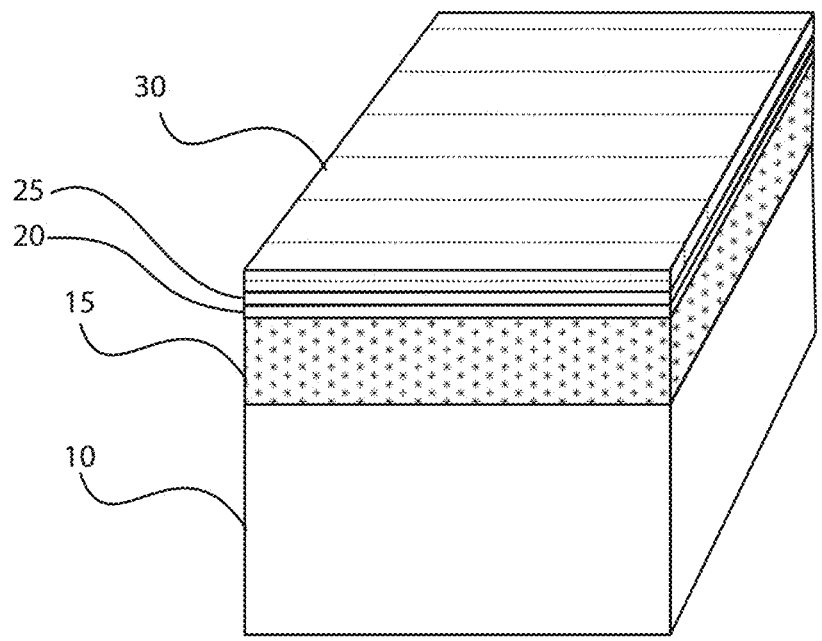
FIG. 3 is a perspective view of forming a photoresist layer on the neutral layer, in accordance with one embodiment of the present disclosure.

FIG. 3 depicts one embodiment of forming a photoresist layer 30 on the neutral layer 25. Photoresists are classified into two groups: positive resists and negative resists. A positive resist is a type of photoresist in which the portion of the photoresist that is exposed to light becomes soluble to the photoresist developer. The portion of the photoresist that is unexposed remains insoluble to the photoresist developer. A negative resist is a type of photoresist in which the portion of the photoresist that is exposed to light becomes insoluble to the photoresist developer. The unexposed portion of the photoresist is dissolved by the photoresist developer. In some embodiments, the photoresist layer 30 may be composed of the Poly(vinyl cinnamate), Poly(methyl methacrylate) (PMMA), Poly(methyl glutarimide) (PMGI), Phenol formaldehyde resin (DNQ/Novolac) or multi-layers and combinations thereof.

The photoresist layer 30 may be deposited on the upper surface of the neutral layer 25 using spin on deposition, spray coating or chemical solution deposition. The photoresist layer 30 may have a thickness ranging from 50 nm to 150 nm. In another embodiment, the photoresist layer 30 may have a thickness ranging from 50 nm to 100 nm.

Figure 4:
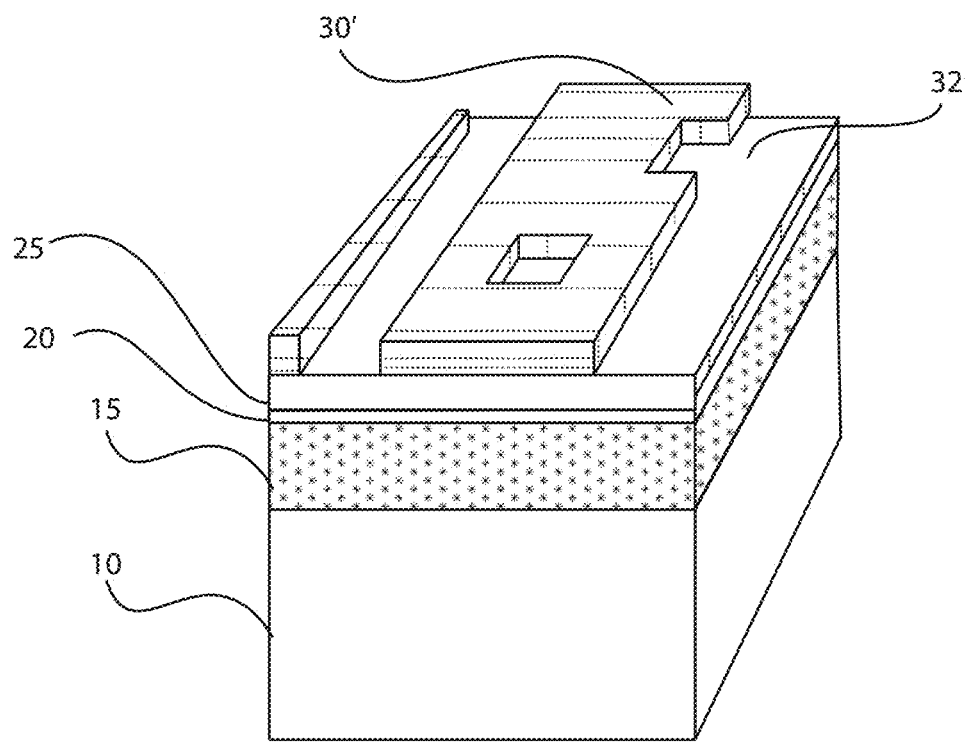
FIG. 4 is a perspective view of patterning the photoresist layer.

FIG. 4 depicts one embodiment of patterning the photoresist layer 30 to form an etch mask 30'. The photoresist layer 30 may be patterned and developed to form an etch mask 30' corresponding to the design of the metal. By "patterned" it is meant that the photoresist layer 30 is selectively irradiated to light through a stencil, e.g., reticle, that is designed to allow light to fall only on preselected areas of the photoresist layer 30. The light causes a chemical change, e.g., cross-linking, in the first photoresist layer 30. The stencil (hereafter referred to as a reticle) comprises a transparent substrate and a pattern layer. The radiant energy blocking portion may be comprised of chrome, chrome oxide, chromium nitride, iron oxide, silicon or a number of other opaque materials. The pattern layer corresponds to the desired positioning of the via openings, and optional metal line openings, which may lead to other metallization in the substrate 10, or may lead to electrical devices in and/or on the substrate 10, such as semiconductor devices and memory devices, as described above.

The radiation, i.e., light, that may be used to expose the photoresist layer 30 through the reticle may include UV, DUV, EUV (extreme UV), and the H and I lines of a mercury-vapor lamp. In another embodiment, photoresist layer 30 may be exposed with an ion beam. Depending upon whether the photoresist is a positive resist or a negative resist, either the exposed portion or the unexposed portion of the photoresist layer 30 may be washed away, i.e., removed, using a developer. Examples of developers for use with positive resists include sodium hydroxide (NaOH) and tetramethyl ammonium hydroxide (TMAH) to be used in combination with a water rinse ($H_2O$). Examples of developers for use with negative resists include xylene with a rinse composed of n-Butylacetate. The remaining portion of the photoresist layer 30 provides an etch mask for the underlying material layers, such as the neutral layer 25, the hardmask 20, the underlayer 15 and in some instances the substrate 10, as depicted in FIG. 4.

Figure 5:
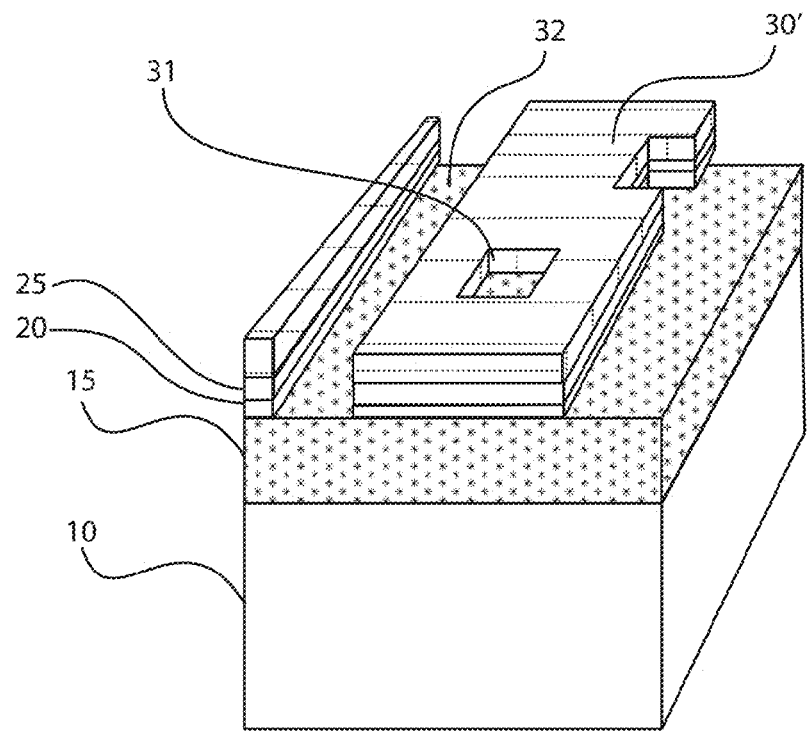
FIG. 5 is a perspective view of transferring the pattern from the photoresist into the neutral layer and the hardmask layer.

FIG. 5 depicts etching the pattern provided by the etch mask 30' into the neutral layer 25 and the hard mask 20. The etch process for removing the material of the hard mask 20 may be selective to the underlayer 15. As used herein, the term "selective" in reference to a material removal process denotes that the rate of material removal for a first material is greater than the rate of removal for at least another material of the structure to which the material removal process is being applied. In one example, the etch that removes the exposed portions of the neutral layer 25 and the hardmask 20 has a selectivity ranging from 1:1 to 100:1 relative to the underlayer 15. In another embodiment, the etch that removes the exposed portions of the neutral layer 25 and the hardmask 20 has a selectivity ranging from 1:1 to 5:1 relative to the underlayer 15.

The etch process for forming the via openings 31 and metal line openings 21 through the neutral layer 25 and the hardmask 20 may be an anisotropic etch process. An anisotropic etch process is a material removal process in which the etch rate in the direction normal to the surface to be etched is greater than in the direction parallel to the surface to be etched. The anisotropic etch may include reactive-ion etching (RIE). Reactive ion etching (RIE) is a form of plasma etching in which during etching the surface to be etched is exposed to reactive gases in the presence of an RF field. During reactive ion etching (RIE) the surface to be etched takes on a potential that accelerates the reactive species extracted from a plasma toward the surface, in which the chemical etching reaction is taking place in the direction normal to the surface. The anisotropic etch may also be provided by ion-beam etching, plasma etching or laser ablation.

Figure 6:
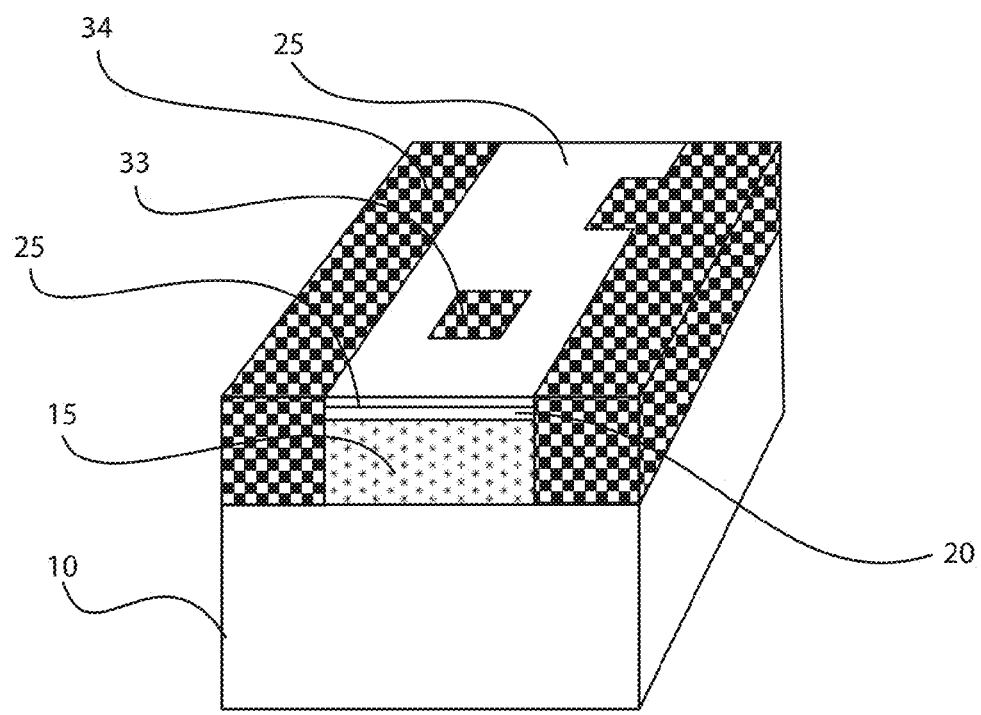
FIG. 6 is a perspective view depicting forming the first metal features in the openings that are formed in the dielectric layer by transferring the pattern from the photoresist into the dielectric layer, in accordance with one embodiment of the present disclosure.

FIG. 6 is a perspective view of transferring the pattern from the etch mask 30' into the underlayer 15 to form the via openings 31 and metal line openings 32 into the underlayer 15, and forming the metal via 33 and the metal lines 34. Following etching of the hardmask layer 20, or following etching of the underlayer 15, the etch mask 30' may be removed using oxygen ashing or a chemical strip. In the embodiments, in which the etch mask 30' is removed prior to etching the underlayer 15, the hardmask layer 20 provides the etch mask for etching the underlayer 15. The underlayer 15 may be etched using an anisotropic etch similar to the etch processes described above for etching the neutral layer 25 and the hardmask layer 20, such as reactive ion etch (RIE). The underlayer 15 may be etched using an etch process that is selective to the substrate 10, and/or the electrical devices and/or metallization with and/or on the substrate 10.

Following via opening and metal line formation, the metal vias 33 and metal containing lines 34 (which can collectively be referred to as first metal features) are formed by depositing a conductive metal into the via openings and metal line openings using deposition methods, such as chemical vapor deposition (CVD) or physical vapor deposition (PVD). The conductive metal may include, but is not limited to: tungsten, copper, aluminum, silver, gold and alloys thereof. Examples of PVD methods suitable for depositing the metal lines and vias include sputtering, plating, electroplating, electroless deposition and combinations thereof. As used herein, "sputtering" means a method of depositing a film of material on a semiconductor surface. A target of the desired material, i.e., source, is bombarded with particles, e.g., ions, which knock atoms from the target, and the dislodged target material deposits on the semiconductor surface.

The metal vias 33 formed in the via openings 31 may have a width W1 ranging from 5 nm to 25 nm. In other embodiments, the via openings 31 may have a width W1 ranging from 10 nm to 20 nm.

Figure 7:
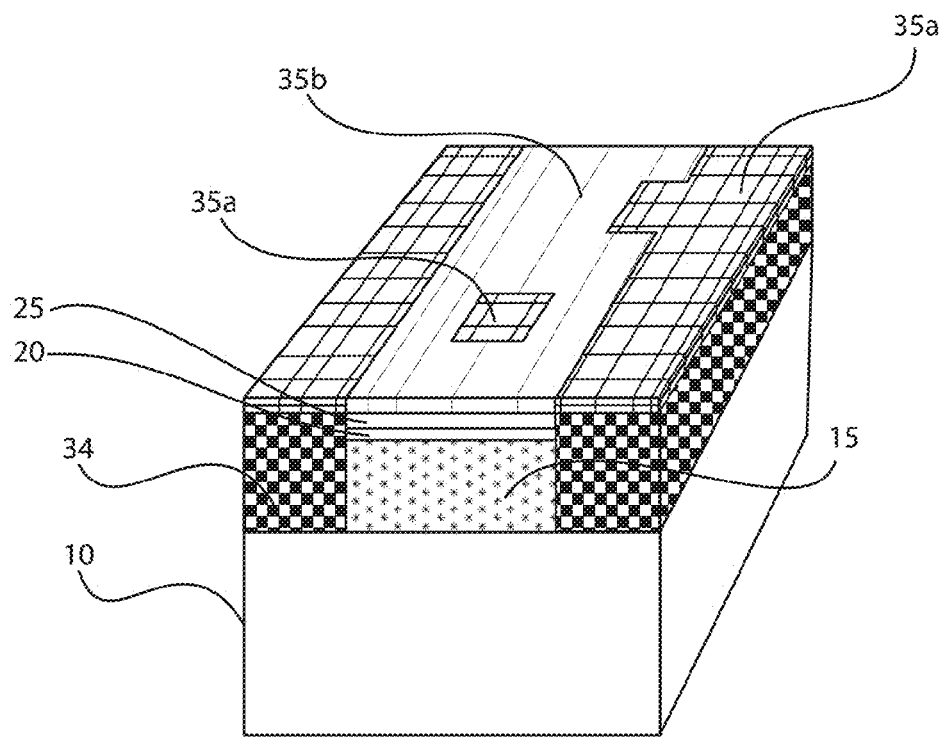
FIG. 7 is a perspective view depicting depositing a self-assembled di-block copolymer material, wherein the self-assembled di-block copolymer forms a first set of lamellae having a first block composition with a first affinity for alignment to the first metal features, and a second set of lamellae having a second block composition with an affinity for alignment the dielectric layer, in accordance with one embodiment of the present disclosure.

FIG. 7 depicts depositing a self-assembled di-block copolymer material 35a, 35b, wherein the self-assembled (SA) di-block copolymer (DBC) forms a first set of lamellae having a first block composition 35a with a first affinity for alignment to the metal features. The neutral layer 25 is equally preferential to the first block composition 35a and the second block composition 35b, but can be tuned to be slightly more preferential to the second block composition 35b to compensate for the fact that there are more second block composition 35b domains standing, i.e., forming lamellae, on the neutral layer 25, as a result of first block composition 35a aligning to the guiding features, i.e., metal containing features, such as the metal vias 33 and metal containing lines 34. Self-assembling materials are comprised of immiscible materials that can phase separate into domains. Phase separation can occur with different types of polymer blends (e.g., binary, ternary) as well as block copolymers comprising two or more immiscible polymeric block components. The term "immiscible" as used herein refers to two or more components (e.g., blocks of a block copolymer, polymers of a polymer blend, and the like) that are incompatible enough to phase separate under certain process conditions.

SA materials for the self-assembled di-block copolymer material 35a, 35b, can comprise immiscible polymer blends. The immiscibility of the polymers in the polymer blends can depend on the composition as well as the film-forming process of the polymer blends. The ratio of the polymers, molecular weights of the individual polymers in the blend, and the presence of other additional components in the blend can be used to adjust the compatibility of the polymers in the polymer blend. Temperature, coating conditions, and underlayer surface properties can also affect the phase separation of the polymers. As used herein, an "immiscible polymer" is a polymer that in a polymer blend composition phase separates on a properly prepared underlayer surface under appropriate process conditions.

Examples of polymers for the two or more immiscible polymer blends include: cellulose, poly(acrylamide), polyethyleneimine, poly(acrylic acid), poly(2-ethyl-2-oxazoline), poly(ethyleneoxide), and poly(vinyl alcohol), novolac resins, cresol resins, poly(hydroxystyrene), poly(acrylic acid), poly(styrene sulfonic acid), poly(vinyl phosphoric acid), poly(vinyl sulfonic acid), poly(2-sulfoethyl methacrylate), poly(2-sulfopropyldimethyl-3-methacrylamide), poly(1,1,1-trifluoro-2-(trifluoromethyl)-2-hydroxy-pentan-4-yl methacrylate), fluoroalcohol-based polymers, poly(2-ethyl-trifluoromethanesulfonamide methacrylate), acidic sulfonamide polymers, poly(styrene), poly(hydroxyadamantyl methacrylate), poly(isobornyl methacrylate), poly(phenyl methacrylate), poly(vinyl naphthalene), polysiloxanes, polymethylsilsesquioxanes, polycarbosilanes, poly(vinyl ferrocene), poly(acylonitrile), poly(caprolactone), poly(lactide), poly(methyl methacrylate), poly(2-hydroxyethyl methacrylate), poly(gamma-butyrolactone methacrylate), poly(tetrahydrofuranyl methacrylate), poly(tetrahydropyranyl methacrylate), poly(allyl amine), poly(4-aminostyrene), poly(2-dimethylaminoethyl methacrylate), polyethyleneneimine, poly(N-methylvinylamine), poly(vinyl pyridine), poly(isoprene), poly(butadiene), poly(nobornene), poly(ethylene), poly(propylene), poly(1,1,1-trifluoro-2-(trifluoromethyl)-2-hydroxy-pentan-4-yl methacrylate), fluoroalcohol-based polymers, poly(2-ethyl-trifluoromethanesulfonamide methacrylate), acidic fluorosulfonamide polymers, poly(2,2,2-trifluoroethyl methacrylate), poly(hexafluoroisopropyl methacrylate), poly(2,3,4,5,6-pentafluoro styrene), and substituted derivatives thereof. The two or more immiscible polymers can be selected such that each polymer is immiscible with each other polymer in the blend.

The SA material of the self-assembled di-block copolymer material 35a, 35b, can comprise a block copolymer, or blends of block copolymers and other polymers. In one embodiment, the block copolymer consists essentially of a first polymeric block component A and a second polymeric block component B that are immiscible with each other.

Typically, homopolymers of suitable immiscible block components form a blend that exhibits multiple glass transition temperatures representing each homopolymer phase. Preferably, one of the components A and B is selectively removable without having to remove the other, so as to form isolated and orderly arranged structural units composed of the un-removed component, or a continuous structural layer containing isolated and orderly arranged cavities formed after the removable component has been removed. Alternatively, the components A and B can simply have different electrical, optical, and/or magnetic properties, so that the ordered patterns composed of such components A and B can be used for fabricating different device structures.

The block copolymer can comprise blocks comprising one or more monomers, and at least two blocks in the block copolymer are compositionally, structurally, or both compositionally and structurally non-identical. Exemplary block copolymers include di-block copolymers, tri-block copolymers, or multi-block copolymers, any of which can be used in conjunction with DSA to further enhance the resolution. The blocks themselves can be homopolymers or copolymers, including terpolymers. The SA material, which forms phase separated structures of chemically different domains, can comprise an amphiphilic organic block copolymer, amphiphilic inorganic block copolymer, organic di-block copolymer, organic multi-block copolymer, inorganic-containing di-block copolymer, inorganic-containing multi-block copolymer, linear block copolymer, star block copolymer, dendritic block copolymer, hyper-branched block copolymer, graft block copolymer, a bottle brush block copolymer, or a combination comprising at least one of the foregoing block copolymers. In an embodiment, the block copolymer is a di-block copolymer. Combining a suitable tri-block copolymer and a chemical pre-pattern can, for example, be used to quadruple the spatial frequency of the chemical pre-pattern.

The block components can in general be any appropriate microdomain-forming block that can be copolymerized with, attached to, or self-organize with another dissimilar block. Blocks can be derived from different polymerizable monomers, where the blocks can include but are not limited to: polyolefins including polydienes, polyethers including poly(alkylene oxides) such as poly(ethylene oxide), poly(propylene oxide), poly(butylene oxide), or random or block copolymers of these; poly((meth)acrylates), polystyrenes, polyesters, polyorganosiloxanes, polyorganogermanes, and the like.

In an embodiment, the blocks of the block copolymer comprise repeating units derived from $C_{2-30}$ olefinic monomers, (meth)acrylate monomers derived from $C_{1-30}$ alcohols, inorganic-containing monomers including those based on Fe, Si, Ge, Sn, Al, Ti, or a combination comprising at least one of the foregoing monomers. In a specific embodiment, exemplary monomers for use in the blocks can include, as the $C_{2-30}$ olefinic monomers, ethylene, propylene, 1-butene, 1,3-butadiene, isoprene, vinyl acetate, dihydropyran, norbornene, maleic anhydride, styrene, 4-hydroxy styrene, 4-acetoxy styrene, 4-methylstyrene, or alpha-methylstyrene; and can include as (meth)acrylate monomers, methyl (meth)acrylate, ethyl (meth)acrylate, n-propyl (meth)acrylate, isopropyl (meth)acrylate, n-butyl (meth)acrylate, isobutyl (meth)acrylate, n-pentyl (meth)acrylate, isopentyl (meth)acrylate, neopentyl (meth)acrylate, n-hexyl (meth)acrylate, cyclohexyl (meth)acrylate, isobornyl (meth)acrylate, or hydroxyethyl (meth)acrylate. Combinations of two or more of these monomers can be used. Exemplary blocks that are homopolymers include blocks prepared using styrene (i.e., polystyrene blocks), or (meth)acrylate homopolymer blocks such as poly(methyl methacrylate); exemplary random blocks include, for example, blocks of styrene and methyl methacrylate (e.g., poly(styrene-co-methyl methacrylate)), randomly copolymerized; and an exemplary alternating copolymer block can include blocks of styrene and maleic anhydride which is known to form a styrene-maleic anhydride dyad repeating structure due to the inability of maleic anhydride to homopolymerize under most conditions (e.g., poly(styrene-alt-maleic anhydride)) where "-alt-" indicates alternating polymeric blocks. It is understood that such blocks are exemplary and should not be considered to be limiting.

More specific di-block or tri-block copolymers include poly(styrene-b-vinyl pyridine) (PS-b-PVP), poly(styrene-b-butadiene) (PS-b-PBD), poly(styrene-b-isoprene) (PS-b-PI), poly(styrene-b-methyl methacrylate) (PS-b-PMMA), poly(styrene-b-alkenyl aromatics), poly(isoprene-b-ethylene oxide) (PI-b-PEO), poly(styrene-b-(ethylene-propylene)), poly(ethylene oxide-b-caprolactone), poly(butadiene-b-ethylene oxide) (PBD-b-PEO), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-dimethylsiloxane) (PS-b-PDMS), poly(styrene-b-ferrocenyldimethylsilane) (PS-b-PFS), poly(styrene-b-isoprene-b-ethylene oxide) (PS-b-PI-b-PEO), poly(styrene-b-isoprene-b-methyl methacrylate) (PS-b-PI-b-PMMA), poly(styrene-b-ferrocenyldimethylsilane-b-isoprene) (PS-b-PFS-b-PI), poly(styrene-b-lactide) (PS-b-PLA) or a combination comprising at least one of the foregoing block copolymers.

Specific examples of self-assembling block copolymers can include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). Other exemplary block copolymers that are contemplated for use in the present method include diblock or triblock copolymers such as, poly(styrene-b-alkenyl aromatics), poly(styrene-b-(ethylene-propylene)), poly(ethylene oxide-b-caprolactone), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-dimethylsiloxane), poly(vinyl pyridine-b-dimethylsiloxane), poly(ethylene oxide-b-dimethylsiloxane), poly(methyl methacrylate-b-dimethylsiloxane), poly(isoprene-b-dimethylsiloxane), poly(isoprene-b-vinyl pyridine), partially epoxidized poly (styrene-b-isoprene) poly(butadiene-b-vinyl pyridine), poly(trimethylsilyl styrene-b-lactic acid), poly(styrene-b-lactic acid), poly(styrene-b-hydroxystyrene), poly(styrene-b-acrylic acid), poly(ethylene oxide-b-hydroxystyrene), poly(methyl methacrylate-b-vinyl pyridine), poly(ethylene oxide-b-methyl methacrylate-b-styrene), poly(styrene-b-isoprene-b-ethylene oxide), poly(methyl methacrylate-b-styrene-b-methyl methacrylate), poly(isoprene-b-styrene-b-ferrocenyldimethylsilane), poly (styrene-b-trimethylsilyl styrene-b-styrene) or a combination including at least one of the foregoing block copolymers.

The polymer blend or block copolymers can also comprise inorganic constituents, including inorganic-containing homopolymers, copolymers, and block copolymers, and inorganic-containing monomers, molecules, and additives. These include, for example, those based on silicon, germanium, iron, titanium, aluminum, or the like.

The block copolymer desirably has an overall molecular weight and polydispersity amenable to further processing. In an embodiment, the block copolymer has a weight-average molecular weight (Mw) of 3,000 to 200,000 g/mol. Similarly, the block copolymer has a number average molecular weight (Mn) of 1,000 to 80,000. The block copolymer can also have a polydispersity (Mw/Mn) of 1.01 to 6, and is not particularly limited thereto. Average molecular weight, both Mw and Mn, can be determined by, for example, gel permeation chromatography using a universal calibration method, calibrated to polystyrene standards.

The block copolymers for the self-assembled di-block copolymer material 35a, 35b, can be prepared by methods previously described in the art, including living polymerization techniques such as atom transfer free radical polymerization (ATRP) nitroxide-mediated radical polymerization, ring-opening metathesis polymerization (ROMP), and living cationic or living anionic polymerizations.

In a particular embodiment, the block copolymer used for forming the self-assembled periodic patterns in the self-assembled di-block copolymer material 35a, 35b, is PS-b-PMMA. The PS and the PMMA blocks in such a PS-b-PMMA block copolymer can have a total (summed over all blocks) number average molecular weight (Mn) ranging from about 5000 to about 300000, with a total number average molecular weight from about 10000 to about 200000 being more typical. Each block can have a Mn of 2000 to 100000, more particularly 5000 to 60000.

The morphology (e.g., shape, dimension, and orientation) of the self-assembled domains from block copolymer thin films is a function of composition (e.g., material, molecular weight, and volume ratio of different blocks), annealing conditions (e.g., temperature, environment, and annealing time), the interface properties (e.g., polymer-air interface and polymer substrate interface) as well as the defined geometry (e.g., film thickness and topography of the confinement). Therefore, by adjusting one or more parameters, the morphology can be adjusted to the need of specific applications.

In order to form the self-assembled periodic patterns, the block copolymer can be first dissolved in a suitable solvent system to form a block copolymer solution, which can then be applied onto the treated layer, thereby forming a thin block-copolymer layer disposed thereon. Optionally, annealing the thin block-copolymer layer can aid in the self-assembly process of the polymeric block components.

In an embodiment, the self-assembled di-block copolymer material 35a, 35b comprises at least one block copolymer. Non-limiting exemplary solvents for the self-assembled di-block copolymer material 35a, 35b include substituted or unsubstituted aromatic hydrocarbons, substituted or unsubstituted aromatic ethers, substituted or unsubstituted aromatic alcohols, saturated monoalcohols comprising 5 to 20 carbons, glycols, ketones, glycol mono ethers, and glycol mono ether esters. In an embodiment, the SA solvent is a glycol, glycol mono ether, glycol mono ether ester, or combinations thereof. More specific solvents for the self-assembled di-block copolymer material 35a, 35b, include but are not limited to toluene, ethylene glycol, propylene glycol, propylene glycol monomethyl ether acetate (PGMEA), propylene glycol monomethyl ether (PGME), 4-methyl-2-pentanol, n-butyl acetate, anisole, acetone, and combinations thereof. In an embodiment, the solvent for the self-assembled di-block copolymer material 35a, 35b is ethylene glycol, propylene glycol, propylene glycol monomethyl ether acetate (PGMEA), propylene glycol monomethyl ether (PGME), 4-methyl-2-pentanol, or combinations thereof. The solution of self-assembled di-block copolymer material 35a, 35b can have a concentration ranging from about 0.1 weight percent (wt. %) to about 5 wt. % SA material based on total weight of the solution. More particularly, the self-assembled di-block copolymer material 35a, 35b is dissolved at a concentration ranging from about 0.5 wt. % to about 2.5 wt. %. In an embodiment, the solution of self-assembled di-block copolymer material 35a, 35b comprises about 0.5 wt. % to about 2.5 wt. % PS-b-PMMA block copolymer dissolved in anisole. The solution of self-assembled di-block copolymer material 35a, 35b can optionally further comprise additional block copolymers, homopolymers, random copolymers, surfactants, and photoacid generators, photobase generators, thermal acid generators, thermal base generators, acid amplifiers, and photodestructible bases.

The application of SA materials to provide the self-assembled di-block copolymer material 35a, 35b to the exposed surfaces of the neutral layer 25 and the exposed metal surfaces of the first metal vias 33 and the first metal containing line 34 can be accomplished by a process including, e.g., spin-casting, dip-coating, doctor blading, spray dispense, or other suitable coating method, which is compatible with the processes and equipment used in microelectronics fabrication assembly lines.

The solution of self-assembled di-block copolymer material 35a, 35b is cast on the upper surface of the structure depicted in FIG. 6 followed by removal of the solvent, thereby forming a thin film of self-assembled di-block copolymer material 35a, 35b. The solution of self-assembled di-block copolymer material 35a, 35b can be cast by any suitable technique, including, but not limited to: spin coating, roll coating, spraying, ink coating, dip coating, and the like.

Additional annealing (including thermal annealing, thermal gradient annealing, and solvent vapor annealing or other gradient field) can be optionally employed to remove defects in the self-assembled di-block copolymer material 35a, 35b, and/or promote self-assembly of the self-assembled di-block copolymer material 35a, 35b. More particularly, the self-assembled di-block copolymer material 35a, 35b comprising a block copolymer can be thermally annealed at a temperature that is above the glass transition temperature (Tg) of the block copolymer but below the decomposition or degradation temperature (Td) of the block copolymer. The thermal annealing step can be carried out at an annealing temperature of about 100° C. to about 300° C. The thermal annealing can be performed for a period of about 1 minute to about 120 hours, more particularly 0.5 minutes to 1 hour. The thermally annealed block copolymer self-assembles to form ordered domains whose orientation can be perpendicular to the underlying surface plane. In general, the SA layer can have a thickness of 100 to 10000 angstroms, more particularly 200 to 5000 angstroms, and even more particularly 300 to 2000 angstroms.

The self-assembled di-block copolymer material 35a, 35b, wherein the self-assembled (SA) di-block copolymer (DBC) self assembles into a first set of lamellae having a first block composition 35a with a first affinity for self-alignment to the metal features, i.e., the first metal vias 33 and the first metal containing lines 34, and a second set of lamellae having a second block composition 35b with an affinity for alignment the neutral layer 25, or no affinity for alignment to the neutral layer. The different block compositions of the self-assembled di-block copolymer material 35a, 35b can be hydrophobic or hydrophilic. Based on whether a block composition is hydrophobic or hydrophilic it will align to exposed dielectric, e.g., neutral layer 25, in the openings, or exposed metal in the openings. The metal surfaces, i.e., first metal via 33 and first metal containing lines 34, that are exposed in the openings through the neutral dielectric layer 25 are typically more hydrophilic. The dielectric, e.g., hardmask layer 20 and underlayer 15, are usually hydrophilic, but the neutral layer 25 is present on top of the dielectric, so that the dielectric is not exposed during the directed self-assembly process. The neutral layer 25 makes the top surface of the dielectric equally preferential to both blocks, enabling the blocks to form vertical lamellae instead of lying down flat.

Figure 8A:
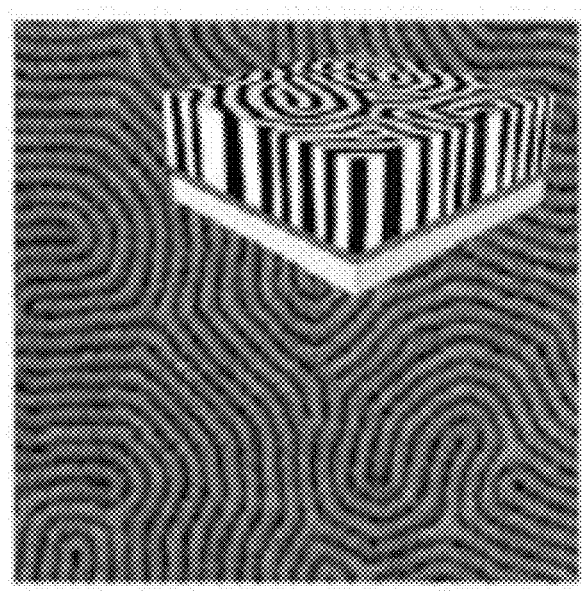
FIG. 8A is a perspective view of vertical lamellae that form atop the neutral layer that is overlying a scanning electron micrograph of vertical lamellae, in accordance with one embodiment of the present disclosure.
Figure 8B:
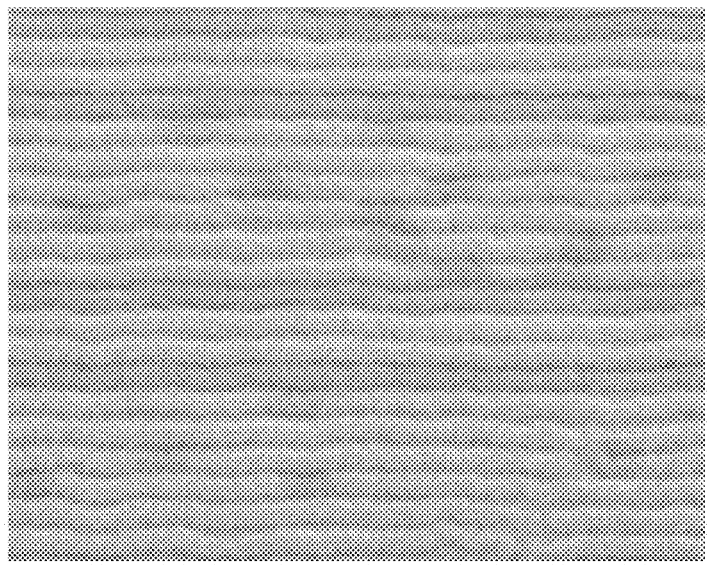
FIG. 8B is a scanning electron micrograph of another embodiment of vertical lamellae that form atop the neutral layer, in accordance with one embodiment of the present disclosure.
Figure 8C:
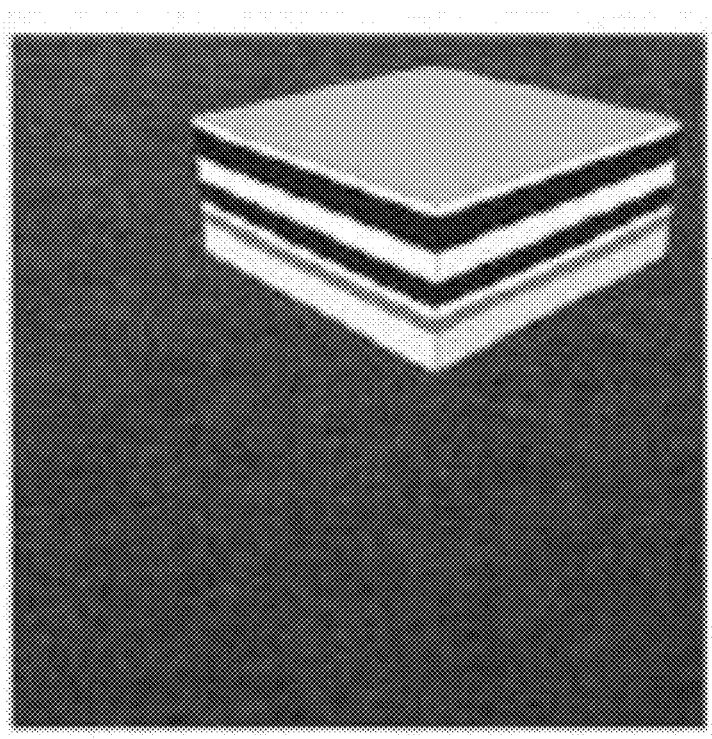
FIG. 8C is a perspective view illustrating a single block composition of the di-block copolymer having an affinity for the metal of the first metal features that is overlying a scanning electron micrograph of the single block composition.

FIGS. 8A and 8B illustrate examples vertical lamellae that form atop the neutral layer 25, which is illustrated by the region of the self-assembled di-block copolymer material identified by reference number 35b. FIG. 8C illustrates a single block composition of the di-block copolymer having an affinity for the metal of the first metal vias 33 and/or the first metal containing lines 34 that are exposed. As opposed to forming vertical lamellae, the single block composition having the affinity for the metal of the first metal vias 33 and/or first metal containing lines 34 lays down upon the metal surface, in which the edges of the single block composition align to the edges of the metal feature, i.e., first metal via 33 and/or first metal containing lines 34. In some embodiments, the centroids align, so that the via size is not necessary the same as the domain size occupied by the first block composition of the self-assembled di-block copolymer material 35a. The regions of the deposited self-assembled di-block copolymer material 35a, 35b, in which a single block composition of the self-assembled di-block copolymer material has an affinity for the metal of the first metal vias 33 and/or the first metal containing lines 34, and therefore a single block composition of the self-assembled di-block copolymer self-aligns with the first metal vias 33 and/or the first metal containing lines 34 are identified by reference number 35b. In summation, the direct self-assembly (DSA) of the self-assembled di-block copolymer material 35a, 35b is primarily driven by the patterned, metal via, hydrophilic region (identified by region 35a), while the rest of the surface (identified by reference number 35b) forms lamellae lines pinned by these regions.

Self-assembly of the self-assembled di-block copolymer material 35a, 35b, can occur during film formation, during a post-application bake, or during a subsequent annealing process. Suitable annealing processes include thermal annealing, thermal gradient annealing, solvent vapor annealing or annealing by other gradient fields. As with the first self-assembled structure, the second self-assembled structure comprises a first domain and a second domain of SA material. The first and the second domains comprise different components of SA material; that is, they are compositionally different. The first domain can, for example, comprise one block of a block copolymer, and the second domain can comprise a different block of a block copolymer.

Figure 9:
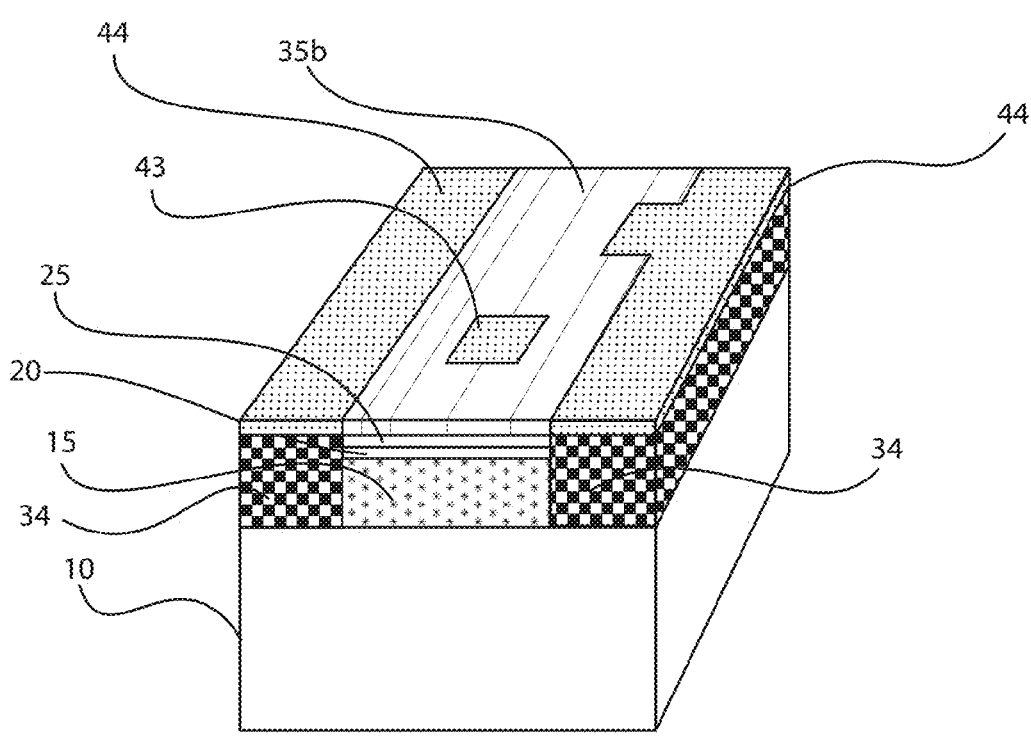
FIG. 9 is perspective view of forming second metal features in the space occupied by the block composition of the di-block copolymer having an affinity for the metal of the first metal features, in accordance with one embodiment of the present disclosure.

FIG. 9 depicts one embodiment of converting the block composition of the self-assembled di-block copolymer material 35a, 35b that has self-aligned with the metal material of the first metal vias 33 and the first metal containing lines 34 into a metal containing features, such as a second metal via 43 and/or second metal containing line 44. In some embodiments, converting the block composition of the self-assembled di-block copolymer material 35a, 35b that has self-aligned with the metal material of the first metal vias 33 and the first metal containing lines 34 into metal containing features comprises sequential infiltration synthesis (SIS). More specifically, the method of converting the block composition of the self-assembled di-block copolymer material 35a, 35b that has self-aligned with the metal material of the first metal vias 33 and the first metal containing lines 34, i.e., first metal features, into a metal containing features, i.e., second metal features, may include sequential infiltration synthesis (SIS) of a metal containing material into the block copolymer composition aligned to the metal containing features; removal of the polymer scaffold of the block copolymer composition that is aligned to the metal containing features; and reduction of the material that was introduced by sequential infiltration synthesis (SIS) into a metal, which provides metal features that are self-aligned to the metal material of the first metal vias 33 and the first metal containing lines 34.

The sequential infiltration synthesis (SIS) process utilizes alternating exposures of gas phase precursors for introducing metal containing elements that infiltrate the organic material, e.g., polymeric material, of the block composition of the self-assembled di-block copolymer material 35a, 35b that has self-aligned with the metal material of the first metal vias 33 and the first metal containing lines 34, i.e., first metal features. The metal containing elements being introduced to the block composition that is aligned with the metal material of the first metal vias 22 and the first metal containing lines 34 may be various metals, metal oxides, and combinations thereof.

In some embodiments, the SIS process involves exposing the self-assembled di-block copolymer material 35a, 35b including the region 35a of self-assembled block copolymer composition, i.e., a single composition (block composition) of the di-block copolymer material, that has self-aligned with the metal material of the first metal vias 33 and the first metal containing lines 34 to various gas phase precursors to synthesize metal components in situ. SIS coats the surface of the self-assembled di-block copolymer material 35a, 35b but also infiltrates into the region 35a of self-assembled block copolymer composition, i.e., a single composition (block composition) of the di-block copolymer material, that has self-aligned with the metal material of the first metal vias 33 and the first metal containing lines 34.

The gas phase precursors are selected for reaction with the self-assembled di-block copolymer material 35a, 35b. A wide range of precursors are available for selection for SIS modification, which produces metals and/or materials capable of are capable of converting into a metal so that the region 35a of self-assembled block copolymer composition, i.e., a single composition (block composition) of the di-block copolymer material, that has self-aligned with the metal material of the first metal vias 33 and the first metal containing lines 34 may be converted into a self-aligned metal feature, such as a metal via or metal line.

Examples of inorganic components prepared by SIS include gold (Au), palladium (Pd), $Al_2O_3$, $TiO_2$, ZnO, $SiO_2$, $HfO_2$, $ZrO_2$ and W. However, other metal oxides, metals, and other inorganic materials may also be prepared using SIS. For example, various known precursors utilized with atomic layer deposition (ALD) in preparation of layers of metal, metal oxide, metal nitride, metal silicide, and metal halide, ternary, and various multi-component metal-containing systems are suitable as the precursors for the SIS process.

In various embodiments of the present methods, the SIS process uses a pair of precursors to form the metal containing elements, where one precursor comprises a metal or metal-containing compound selected to infiltrate into and react with the region 35a of self-assembled block copolymer composition, i.e., a single composition (block composition) of the di-block copolymer material, that has self-aligned with the metal material of the first metal vias 33 and the first metal containing lines 34. The second precursor comprises a compound selected to react with the first precursor (or a portion thereof) bound to the surface and within the bulk of the region 35a of self-assembled block copolymer composition, i.e., a single composition (block composition) of the di-block copolymer material, that has self-aligned with the metal material of the first metal vias 33 and the first metal containing lines 34.

The metal containing element is accordingly synthesized on the surface of the self-assembled di-block copolymer material 35a, 35b and within the bulk of the region 35a that is present aligned to the underlying metal containing materials, i.e., metal vias 33 and/or metal containing lines 34, by reaction of the first precursor and the second precursor. Although a wide range of precursors are suitable for SIS-modification, examples of various precursors include, but are not limited to: trimethyl aluminum (TMA), titanium tetrachloride ($TiCl_4$), diethyl zinc (DEZ), and tungsten hexafluoride ($WF_6$). In one example, a metal containing element, such as $Al_2O_3$ may be utilized to seed the growth of other inorganic materials which do not have direct selective chemistry with pure PS-b-PMMA polymer, e.g., ZnO, MgO, $SiO_2$, etc.

The second precursor is selected in view of the first precursor to carry out the SIS reaction within the region 35a of the self-assembled di-block copolymer material 35a, 35b that is present aligned to the underlying metal containing materials, i.e., metal vias 33 and/or metal containing lines 34 to form the metal element which is later converted to a metal feature, e.g., self-aligned metal via and/or metal containing line. In various embodiments, the second precursor may be an oxygen source (e.g., $H_2O$, $O_2$, $O_3$, $H_2O_2$), a reducing agent ($H_2$, $H_2S_2Si_2H_6$, etc.), or other compound reactive with the first precursor. For instance, in some embodiments the second precursor (e.g., $H_2O$, $H_2S$) can be selected to react with or bind to a specific functional group in the resist material and utilized first in the SIS sequence, and the metal-containing precursor can be utilized next in the SIS sequence so as to react with the adsorbed or bound second precursor.

By way of example, SIS of a PMMA containing self-assembled di-block copolymer material 35a, 35b may be achieved by reacting the PMMA layer with various gas-phase precursors for synthesis of metal containing elements. PMMA is a common high-resolution electron beam resist material. In various embodiments, the metal containing element may be, for example, $Al_2O_3$. Other metal containing elements that may be provided can include tungsten W, titanium dioxide ($TiO_2$) and combinations thereof. However, other metal containing elements may be prepared by SIS modification of PMMA, as well as SIS modification of other block copolymer materials, including polyhydroxystyrene-based polymers, polyimides, and others.

The SIS process results in the metal element infiltrating into the bulk of the region 35a of the self-assembled di-block copolymer material 35a, 35b that is present aligned to the underlying metal containing materials, i.e., metal vias 33 and/or metal containing lines 34, and does not merely coat exposed surfaces of the self-assembled di-block copolymer material 35a, 35b. By varying the pressure, temperature, and reaction timing of the SIS process precursors, the depth of penetration of the metal containing element into the self-aligned block copolymer region 35a, i.e., block composition having affinity for the metal of the metal vias 33 and/or metal containing lines 34, is controllable. The depth of penetration of the metal element can also be controlled by selecting SIS process precursors with specific diffusivities in the resist material layer.

The SIS process may include a plurality of alternating exposures of the self-assembled di-block copolymer material 35a, 35b to a metal precursor compound, e.g., trimethyl aluminum (TMA), which may be the first precursor, and a reactant precursor, e.g., $H_2O$, which may be the second precursor. Each precursor exposure can result in a self-limited half-reaction with the block composition of the self-assembled di-block copolymer material 35a, 35b that is aligned to the underlying metal features, e.g., metal via 33 and/or metal containing line 34, which is illustrated by the region identified by reference number 35a. A purge step (e.g., $N_2$) may be performed following each precursor exposure to remove residual reactant. Exposures of each reactant can be performed in one step or in a series of two or more steps to control the amount of material that infiltrates the region 35a of the self-assembled di-block copolymer material 35a, 35b that is present aligned to the underlying metal containing materials, i.e., metal vias 33 and/or metal containing lines 34. In one example, the exposures can be carried out at a temperature of ranging from 60° C. to 100° C., e.g., about 85° C., and a pressure of ranging from 1 Torr to 10 Torr, e.g., about 5 Torr. In one example, five SIS cycles may be performed including an approximately 60-second TMA exposure and an approximately 300-second $H_2O$ exposure in each cycle.

In one embodiment, in which the block composition aligned with the metal features, i.e., metal vias 33 and/or metal containing lines 34, includes PMMA, the PMMA domains can be first modified chemically by reaction with TMA, with the aluminum (Al) of the TMA bonding to the PMMA in a highly controllable fashion, owing to the stepwise molecule assembly process. The TMA precursor infiltrates into the bulk of the PMMA. The second precursor, in this case water, completes the reaction with the Al bonded to the surface and within the PMMA bulk, forming the metal element, e.g., a metal element composed of $Al_2O_3$.

Following infiltration of the metal element into one specific polymer phase of the self-assembled di-block copolymer material 35a, 35b, i.e., the block copolymer composition having the affinity for the metal material of the underlying metal vias 33 and metal containing lines 34, the conversion of the block composition continues with removal of the polymer scaffold and reduction of the SIS material into a metal feature 43, 44. Removal of the polymer scaffold may include dissolving the PMMA using an ultraviolet (UV) light treatment in combination with a solvent such as MIBK, IPA or an acid, such as acetic acid. This removes the polymer scaffold leaving the metal element, e.g., metal oxide or other compound that can be reduced to a metal, self-aligned to the underlying metal vias 33 and metal containing lines 34. High temperature annealing, and oxygen-based etching can also be used to remove polymer scaffold.

In a following process step, the metal element is reduced to an elemental metal to provide a metal feature, e.g., metal via 43 and/or metal containing line 44, at the level in which the self-assembled di-block copolymer material 35a, 35b was formed. Because the metal element was formed using the SIS process from a block composition of the self-assembled di-block copolymer material 35a, 35b that was aligned to an underlying metal containing feature, e.g., metal via 33 and/or metal containing line 34, the metal element being reduced is self-aligned to the underlying metal containing feature, e.g., metal via 33 and/or metal containing line 34. This provides that the metal features, i.e., second metal features, being converted from the SIS metal elements, e.g., metal via 43 and/or metal line 44, is self-aligned with the underlying metal containing feature, e.g., metal via 33 and/or metal containing line 34 (also referred to as first metal features).

As used herein, the term "reduction" denotes a process of producing metals from metal containing elements, such as metal oxides and ores, using reduction reactions. The reduction of metals may include reactions used to obtain metals from their oxides by using substances having greater affinity for oxygen than the metal. For example, reduction reactions with hydrogen, or with a more reactive metal, such as calcium, can be applied depending on the thermal budget allowed for the underlayer stack. For example, hydrogen may be used in the synthesis of platinum group metals, germanium, rhenium, fine nickel and cobalt powders. Hydrogen may also be used in the synthesis of tungsten and molybdenum resulting from hydrogen reduction of their oxides. Further details the formation of metals via reduction employing hydrogen can be found in Stefan Luidold, et al., *Hydrogen as a reducing agent: State-of-the-art science and technology*, JOM, June, 2007 at 20. Another example of reduction of metals can be found in G. B. Schaeffer, et al., Reduction of metal oxides by mechanical alloying, Appl. Phys. Lett. 55, 45, (1989).

In another embodiment, instead of employing SIS processing to form metal features directly from a block composition of self-assembled di-block copolymer material 35a, 35b that has aligned itself to the underlying metals, an etch process may be used to remove the self-aligned block composition selectively to the remaining block composition to form openings to the first metal features. For example, one of the domains, e.g., the block composition occupying region 35a of the self-assembled di-block copolymer material 35a, 35b, can be selectively removed (e.g., ion-etched) or modified in the presence of the other domain, i.e., the remainder of the assembled di-block copolymer material 35a, 35b. The selective removal process can be carried out by a thermal bake (for thermally decomposable materials), a reactive ion etch process, dissolution in a selective solvent, or a combination thereof. A chemical modification can be accomplished by a variety of known methods. For example, domains can be selectively reacted with silanes or silyl chlorides to introduce silicon content into a domain and thereby increase its plasma etch resistance. Alternatively, chemical agents may be used to bind or chemically couple to functional groups that are exclusively located in one type of self-assembled domain, to effect, for example, increased solubility property differences that can advantageously be used to selectively remove one domain in the presence of the other domain.

The difference in the etch rates between two ordered domain regions of the block copolymer, and between the underlying materials, allows the generation of complex and customized patterns. Selectively removing by etching, solvent or other means, at least one self-assembled domain, creates a nano-scale relief pattern.

Types of etching may include any common etching applied in the manufacture of semiconductor devices, for example, dry-etching such as plasma etching, or wet-etching using selective solvents. In some embodiments, prior to this domain pattern development/pattern transfer, the self-assembled layer of SA material can be optionally chemically modified to improve properties necessary for pattern transfer, such as etch resistance or mechanical properties.

In some embodiments, because the block composition occupying region 35a of the self-assembled di-block copolymer material 35a, 35b, is self-aligned to the underlying metal features, i.e., metal vias 33 and/or metal containing lines 34, removing the block composition occupying region 35a, selectively to the portions of self-assembled di-block copolymer material 35a, 35b occupying region 35b will provide openings through a mask that are aligned to the metal vias 33 and/or metal containing lines 34.

The openings provided by selectively removing the block composition occupying region 35a of the self-assembled di-block copolymer material 35a, 35b may then be filled with an electrically conductive material to provide metal features, e.g., metal vias 43 and/or metal lines 44, that are self-aligned to the metal features, e.g., metal vias 33 and/or metal lines 34, that are present underlying the layer of the self-assembled di-block copolymer material 35a, 35b.

In some embodiments, the openings may be filled with an electrically conductive material that is deposited using physical vapor deposition (PVD) and/or chemical vapor deposition (CVD). The conductive metal may include, but is not limited to: tungsten, copper, aluminum, silver, gold and alloys thereof. Examples of PVD methods suitable for depositing the metal lines and vias include sputtering, plating, electroplating, electroless deposition and combinations thereof.

The methods described above with reference to FIGS. 1-9 provide an electrical communication structure that can include first metal features 33, 34, e.g., metal vias 33, in a dielectric layer 15, optionally including the hardmask layer 20, and a neutral charged di-block polymer layer 25. As discussed above, the neutral charged di-block polymer layer 25 (also referred to as neutral layer 25) is present atop the hardmask layer 20, wherein the hardmask layer 20 is present atop the dielectric layer 15. The electrical communication structure may further include metal lines 44 and/or metal vias 43 (which can collectively be referred to as second metal features), present in a layer including a block copolymer composition from a self-assembled di-block copolymer layer that is present atop the neutral charged di-block polymer layer. The metal lines 44 can be are self-aligned to the vias 34.

The remaining block copolymer composition in the electrical communication structure of the self-assembled di-block copolymer material 35a, 35b that has not been converted to a metal feature, or removed to provide openings to an underlying metal feature, may include polyolefins, polydienes, polyethers, poly(alkylene oxides), poly(ethylene oxide), poly(propylene oxide), poly(butylene oxide), poly ((meth)acrylates), polystyrenes, polyesters, polyorganosiloxanes, polyorganogermanes or combinations thereof.

It is noted that by using the SIS process disclosed herein, the metal containing lines 44 and metal vias 43 that are formed herein may be present without the need for a metal liner, such as a metal nitride liner, e.g., TiN, TaN, WN and combinations thereof, that is present between the metal containing lines and metal vias and the dielectric layer that these structures are present in, e.g., the remaining portion of the self-assembled di-block copolymer material 35a, 35b. In some embodiments, the metal containing lines 44 and metal vias 43 may be present in direct contact with the remaining portion of the self-assembled di-block copolymer material 35*a*, 35*b*.

The metal vias and metal containing lines that have been described above with reference to FIGS. 1-9 may be employed in any electrical device. For example, the metal vias and metal containing lines that are disclosed herein may be present within electrical devices that employ semiconductors that are present within integrated circuit chips. The integrated circuit chips including the disclosed interconnects may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

Having described preferred embodiments of a methods and structures disclosed herein, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming electrically conductive structures that are aligned to underlying metal features comprising:
   forming a neutral layer overlying a dielectric layer;
   patterning the neutral layer and the dielectric layer to provide openings that are filled with a metal material to provide first metal features;
   depositing a self-assembled di-block copolymer material on a patterned surface of the neutral layer and the first metal features, the self-assembled di-block copolymer material includes a first block composition with a first affinity for alignment to the first metal features;
   converting the first block composition of the self-assembled di-block copolymer to second metal features that are self-aligned to the first metal features.

2. The method of claim 1, wherein the neutral layer comprises a neutral charged di-block polymer.

3. The method of claim 2, wherein the neutral layer comprises a coating of a crosslinked epoxy-containing polymer prepared from monomers comprising glycidyl (meth)acrylate, 2, 3-epoxycyclohexyl (meth)acrylate, (2,3-epoxycyclohexyl)methyl (meth)acrylate, 5,6-epoxynorbornene (meth)acrylate, epoxydicyclopentadienyl (meth)acrylate, or combinations thereof.

4. The method of claim 1 further comprising a hard mask layer between the neutral layer and the dielectric layer.

5. The method of claim 1, wherein the self-assembled di-block copolymer material assembles into a first and second set of lamellae, the first set of lamellae comprise the first block composition and the second set of lamellae comprise a second block composition of the self-assembled di-block copolymer material.

6. The method of claim 1, wherein the second set of lamellae are present on a surface of the neutral layer.

7. The method of claim 1, wherein the first metal features comprise at least one via, and said second metal feature comprises at least one metal line.

8. The method of claim 1, wherein the self-assembled di-block copolymer material comprises polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), polyisoprene-block-polymethylmethacrylate (PI-b-PMMA) or combinations thereof.

9. The method of claim 1, wherein said converting the first block composition of the self-assembled di-block copolymer to a second metal feature that is self-aligned to the first metal features comprises:
   sequential infiltration synthesis (SIS) of a metal containing material into the first block composition of the self-assembled di-block copolymer;
   removal of the polymer scaffold of the first block composition of the self-assembled di-block copolymer; and
   reduction of the metal containing material into a metal that provides said second metal features.

10. The method of claim 9, wherein said reduction of the metal containing material comprises reduction of a metal oxide with a hydrogen gas.

11. A method of forming electrically conductive structures that are aligned to underlying metal features comprising:
   forming a neutral layer overlying a dielectric layer;
   forming first metal features through the neutral layer and the dielectric layer;
   depositing a self-assembled di-block copolymer material atop the neutral layer and the first metal features, wherein the self-assembled di-block copolymer material includes a first block composition with a first affinity for alignment to the first metal features;
   removing the first block composition of the self-assembled di-block copolymer material that is aligned with the first metal features selectively to a remainder of the self-assembled di-block that is not aligned with the first metal features; and
   forming a metal in opening provided by said removing the first block composition to provide second metal features that are self-aligned with the first metal features.

12. The method of claim 11, wherein the neutral layer is comprised of a neutral charged di-block polymer.

13. The method of claim 11 further comprising a hard mask layer between the neutral layer and the dielectric layer.

14. The method of claim 11, wherein the self-assembled di-block copolymer material assembles into a first and second set of lamellae, the first set of lamellae comprise the first block composition and the second set of lamellae comprise a second block composition of the self-assembled di-block copolymer material.

15. The method of claim 11, wherein said removing the first block composition comprises an etch process.

16. The method of claim 11, wherein said forming the metal in the opening provided by said removing the first block composition to provide the second metal features comprises chemical vapor deposition, physical vapor deposition or a combination thereof.

* * * * *